US011011089B2

(12) United States Patent
Liang et al.

(10) Patent No.: US 11,011,089 B2
(45) Date of Patent: May 18, 2021

(54) SHIFT REGISTER UNIT AND METHOD FOR DRIVING THE SAME, GATE DRIVING CIRCUIT, ARRAY SUBSTRATE AND DISPLAY APPARATUS

(71) Applicants: BOE Technology Group Co., Ltd., Beijing (CN); Chongqing BOE Optoelectronics Technology Co., Ltd., Chongqing (CN)

(72) Inventors: Xuebo Liang, Beijing (CN); Zhi Zhang, Beijing (CN); Xiuzhu Tang, Beijing (CN); Qian Qian, Beijing (CN); Taoliang Tang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 182 days.

(21) Appl. No.: 16/136,508

(22) Filed: Sep. 20, 2018

(65) Prior Publication Data

US 2019/0096307 A1 Mar. 28, 2019

(30) Foreign Application Priority Data

Sep. 26, 2017 (CN) .......................... 201710883188.2

(51) Int. Cl.
| | |
|---|---|
| G11C 19/00 | (2006.01) |
| G09G 3/20 | (2006.01) |
| G11C 19/28 | (2006.01) |
| G09G 3/36 | (2006.01) |

(52) U.S. Cl.
CPC ............... *G09G 3/20* (2013.01); *G11C 19/28* (2013.01); *G11C 19/287* (2013.01); *G09G 3/3677* (2013.01); *G09G 2300/0809* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2014/0152629 A1* | 6/2014 | So | ........................ | G11C 19/28 345/205 |
| 2018/0061508 A1* | 3/2018 | Chen | ..................... | G09G 3/3677 |
| 2018/0204496 A1* | 7/2018 | Zhang | ...................... | G09G 3/20 |
| 2019/0114951 A1* | 4/2019 | Li | ............................. | G09G 3/20 |
| 2019/0279588 A1* | 9/2019 | Kim | ....................... | G11C 19/28 |
| 2019/0311691 A1* | 10/2019 | Feng | ...................... | G11C 19/28 |

* cited by examiner

*Primary Examiner* — Tuan T Lam
(74) *Attorney, Agent, or Firm* — Westman, Champlin & Koehler, P.A.

(57) ABSTRACT

The present application discloses a shift register unit and a method for driving the same, a gate driving circuit, an array substrate, and a display apparatus. The shift register unit includes an input sub-circuit; a first output sub-circuit configured to output a first output signal to an output signal terminal, so that the output signal terminal outputs a gate driving signal having a first valid level; and a second output sub-circuit configured to output a second output signal to the output signal terminal, so that the output signal terminal outputs a gate driving signal having a second valid level, wherein an absolute value of the second valid signal is greater than an absolute value of the first valid level.

20 Claims, 8 Drawing Sheets

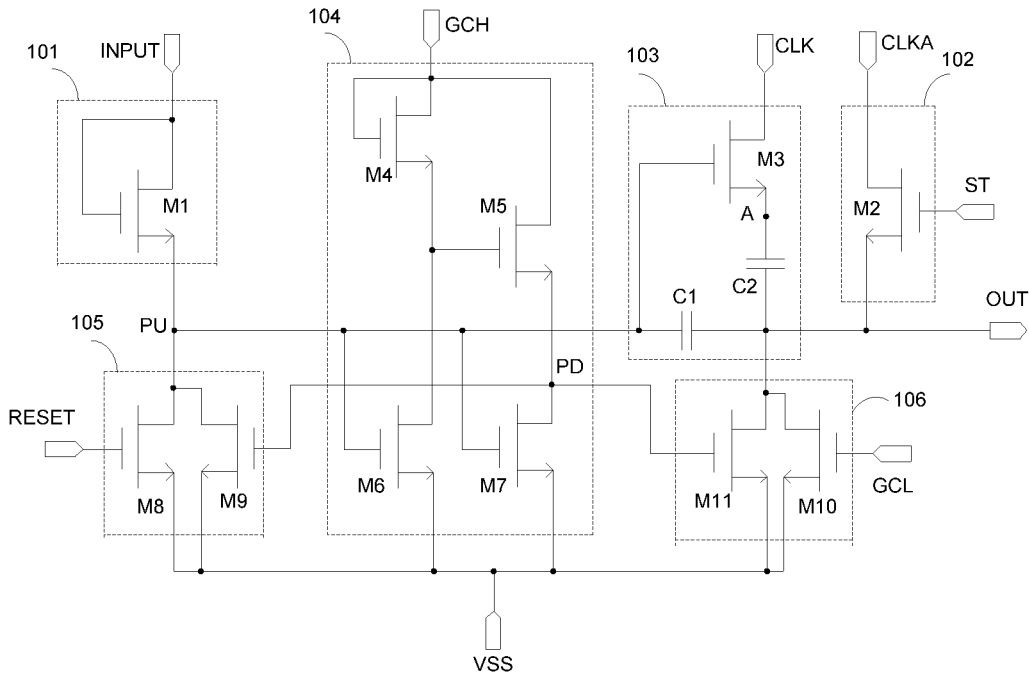

Fig. 5

| In a first period, a first voltage signal and a first clock signal having a first valid level are provided, so that the output signal terminal outputs a gate driving signal having a first valid level | 201 |

| In a second period, an input signal and a second clock signal having a first valid level are provided, so that the output signal terminal outputs a gate driving signal having a second valid level | 202 |

Fig. 6a

SHIFT REGISTER UNIT AND METHOD FOR DRIVING THE SAME, GATE DRIVING CIRCUIT, ARRAY SUBSTRATE AND DISPLAY APPARATUS

CROSS-REFERENCE TO RELATED APPLICATION(S)

This application claims priority to the Chinese Patent Application No. 201710883188.2, filed on Sep. 26, 2017, which is incorporated herein by reference in its entirety.

TECHNICAL FIELD

The present disclosure relates to the field of display technology, and more particularly, to a shift register unit and a method for driving the same, a gate driving circuit, an array substrate, and a display apparatus.

BACKGROUND

In order to pursue a lower cost and a narrower bezel when manufacturing a display apparatus, more and more display panel products adopt the Gate driver On Array (GOA) technology, i.e., directly manufacturing a gate driving circuit of a Thin Film Transistor (TFT) on an array substrate, thereby reducing space occupation of bonding and fan-out regions, and achieving cost reduction in terms of materials and manufacturing processes and the like, and narrowing the bezel on opposite sides of gate lines of the display panel.

SUMMARY

Embodiments of the present disclosure propose a shift register unit and a method for driving the same, a gate driving circuit, an array substrate, and a display apparatus.

According to a first aspect of the embodiments of the present disclosure, there is provided a shift register unit, comprising: an input signal terminal configured to receive an input signal, a first voltage signal terminal configured to receive a first voltage signal, a first clock signal terminal configured to receive a first clock signal, a second clock signal terminal configured to receive a second clock signal and an output signal terminal configured to output a gate driving signal, the shift register unit further comprising:

an input sub-circuit configured to receive the input signal and output a pull-up signal according to the input signal;

a first output sub-circuit configured to receive the first voltage signal and the first clock signal, and output a first output signal to the output signal terminal according to the first voltage signal and the first clock signal, so that the output signal terminal outputs a gate driving signal having a first valid level; and a second output sub-circuit configured to receive the pull-up signal and the second clock signal, and output a second output signal to the output signal terminal according to the pull-up signal and the second clock signal, so that the output signal terminal outputs a gate driving signal having a second valid level, wherein an absolute value of the second valid signal is greater than an absolute value of the first valid level.

In an embodiment, the input sub-circuit comprises a first transistor, wherein the first transistor has a gate and a first electrode both connected to the input signal terminal to receive the input signal, and a second electrode connected to a pull-up node to output the pull-up signal to the pull-up node.

In an embodiment, the first output sub-circuit comprises a second transistor, wherein the second transistor has a gate connected to the first voltage signal terminal to receive the first voltage signal, a first electrode connected to the first clock signal terminal to receive the first clock signal, and a second electrode connected to the output signal terminal to output the first output signal.

In an embodiment, the second output sub-circuit comprises a third transistor, a first capacitor, and a second capacitor, wherein the third transistor has a gate connected to a pull-up node to receive the pull-up signal, a first electrode connected to the second clock signal terminal to receive the second clock signal, and a second electrode connected to a first terminal of the second capacitor, the first capacitor has a first terminal connected to the pull-up node, and a second terminal connected to the output signal terminal, and the second capacitor has a second terminal connected to the output signal terminal.

In an embodiment, the shift register unit further comprises: a second voltage signal terminal configured to receive a second voltage signal, a third voltage signal terminal configured to receive a third voltage signal, and a noise control sub-circuit, wherein the noise control sub-circuit is configured to receive the pull-up signal, the second voltage signal, and the third voltage signal, and control a voltage at the first noise control node according to the pull-up signal, the second voltage signal, and the third voltage signal.

In an embodiment, the noise control sub-circuit comprises a fourth transistor, a fifth transistor, a sixth transistor, and a seventh transistor, wherein the fourth transistor has a gate and a first electrode both connected to the second voltage signal terminal to receive the second voltage signal, and a second electrode connected to a second noise control node, the fifth transistor has a gate connected to the second noise control node, a first electrode connected to the second voltage signal terminal to receive the second voltage signal, and a second electrode connected to the first noise control node, the sixth transistor has a gate connected to the pull-up node, a first electrode connected to the second noise control node, and a second electrode connected to the third voltage signal terminal to receive the third voltage signal, and the seventh transistor has a gate connected to the pull-up node, a first electrode connected to the first noise control node, and a second electrode connected to the third voltage signal terminal to receive the third voltage signal.

In an embodiment, the shift register unit further comprises a first reset signal terminal configured to receive a first reset signal and a first reset sub-circuit, wherein the first reset sub-circuit is configured to receive the pull-up signal, the first reset signal, and the third voltage signal, and reset the pull-up node to an invalid level according to the pull-up signal, the first reset signal, and the third voltage signal.

In an embodiment, the first reset sub-circuit comprises an eighth transistor and a ninth transistor, wherein the eighth transistor has a gate connected to the first reset signal terminal to receive the first reset signal, a first electrode connected to the pull-up node, and a second electrode connected to the third voltage signal terminal to receive the third voltage signal, and the ninth transistor has a gate connected to the first noise control node, a first electrode connected to the pull-up node, and a second electrode connected to the third voltage signal terminal to receive the third voltage signal.

In an embodiment, the shift register unit further comprises a second reset signal terminal configured to receive a second reset signal and a second reset sub-circuit, wherein the second reset sub-circuit is configured to receive the second reset signal and the third voltage signal, and reset the output signal terminal to an invalid level according to the second reset signal and the third voltage signal.

In an embodiment, the second reset sub-circuit comprises a tenth transistor and an eleventh transistor, wherein the tenth transistor has a gate connected to the second reset signal terminal to receive the second reset signal, a first electrode connected to the output signal terminal, and a second electrode connected to the third voltage signal terminal to receive the third voltage signal, and the eleventh transistor has a gate connected to the first noise control node, a first electrode connected to the output signal terminal, and a second electrode connected to the third voltage signal terminal to receive the third voltage signal.

According to a second aspect of the embodiments of the present disclosure, there is provided a method for driving the shift register unit according any embodiment described above, comprising:

providing, in a first period, the first voltage signal and the first clock signal having the first valid level, so that the output signal terminal outputs the gate driving signal having the first valid level; and providing, in a second period, the input signal and the second clock signal having the first valid level, so that the output signal terminal outputs the gate driving signal having the second valid level.

In an embodiment, the driving method further comprises:

providing, in a third period, the first reset signal having a valid level, so that the pull up node is reset to an invalid level In an embodiment, the driving method further comprises:

in the first period, the second period and the third period, providing the second voltage signal having a valid level and the third voltage signal having an invalid level.

According to a third aspect of the embodiments of the present disclosure, there is provided a gate driving circuit, comprising N stages of cascaded shift register units, wherein N is an integer greater than 1, at least one of the N stages of shift register units is the shift register unit described above.

According to a fourth aspect of the embodiments of the present disclosure, there is provided an array substrate, comprising the gate driving circuit described above.

According to a fifth aspect of the embodiments of the present disclosure, there is provided a display apparatus, comprising the array substrate according to described above.

BRIEF DESCRIPTION OF THE DRAWINGS

FIG. 5 is a structural diagram of a shift register unit according to yet another embodiment of the present disclosure;

FIG. 6a is a flowchart of a method for driving a shift register unit according to an embodiment of the present disclosure;

DETAILED DESCRIPTION

In order to make the purposes, technical solutions and advantages of the present disclosure more clear and apparent, the present disclosure will be further described in detail below in combination with specific embodiments with reference to accompanying drawings.

It should be illustrated that all expressions using "first" and "second" in the embodiments of the present disclosure are used to distinguish two different entities or parameters with the same name from each other. Thus, "first" and "second" are only for convenience of the description, and should not be construed as limiting the embodiments of the present disclosure, which will not be described again in subsequent embodiments.

Transistors used in the embodiments of the present disclosure may be thin film transistors or field effect transistors or other devices having the same characteristics. In some embodiments, thin film transistors used in the embodiments of the present disclosure may be oxide semiconductor transistors. As a source and a drain of a thin film transistor used here are symmetrical, the source and the drain thereof may be interchanged. In the embodiments of the present disclosure, one of the source and the drain is referred to as a first electrode, and the other of the source and the drain is referred to as a second electrode. In the following examples, N-type thin film transistors are taken as an example for description. It should be known to those skilled in the art that a type of each transistor (N-type or P-type) is simply changed, and positive and negative polarities of output voltages at various power supply terminals and control signal lines are simply changed to implement the same technical solution of performing turn-on or turn-off operations on various transistors as in the present embodiment, which also falls within the protection scope of the present application. Details thereof will not be described again here.

In the embodiments of the present disclosure, the term "valid level" refers to a level for turning on a transistor when being applied to a gate of the transistor, and the term "invalid level" refers to a level for turning off a transistor when being applied to a gate of the transistor. In a case where N-type thin film transistors are taken as an example for description, the "valid level" corresponds to "a high level" and the "invalid level" corresponds to "a low level". In the following, a first valid level is exemplarily taken as V, and a second valid level is exemplarily taken as 2V. It can be understood that in other embodiments, the first valid level and the second valid level may have other numerical relationships, as long as an absolute value of the first valid level is less than an absolute value of the second valid level.

Figure 1A:
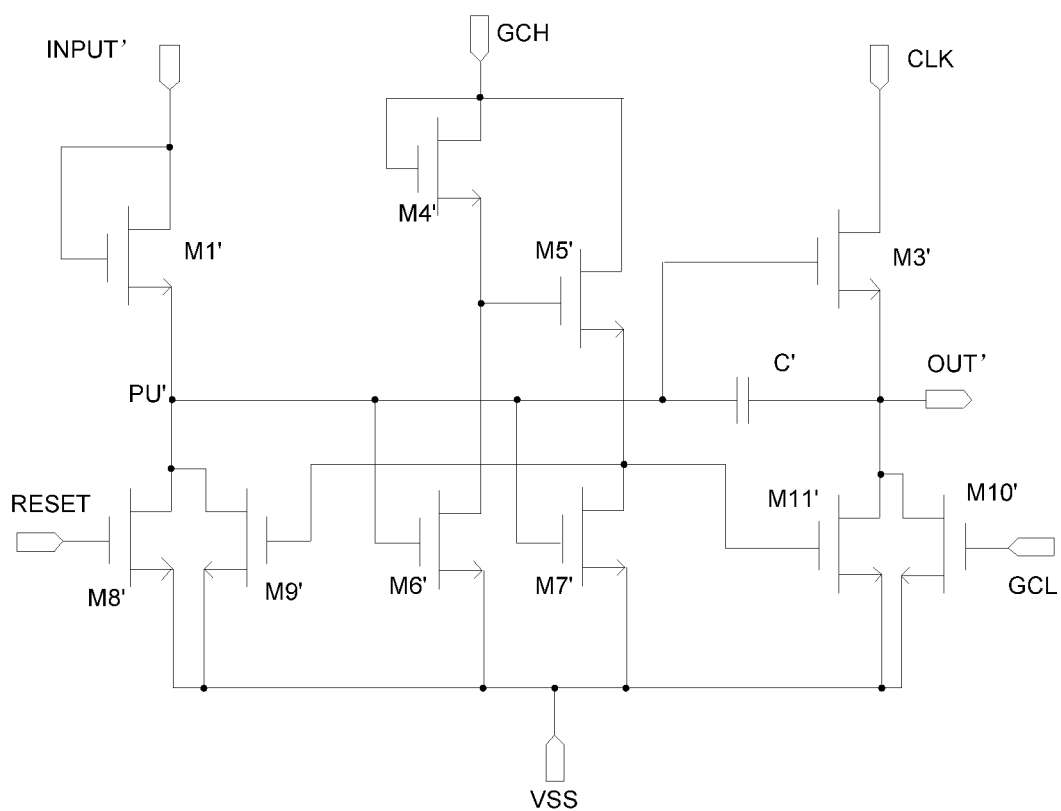
FIG. 1a is a structural diagram of a shift register unit in the related art.

FIG. 1a is a structural diagram of a shift register unit in the related art. The shift register unit shown in FIG. 1a is composed of transistors M1' and M3' to M11' and a capacitor C', and an output sub-circuit of the shift register unit is composed of the transistor M3' and the capacitor C'. The shift register unit outputs a signal to an output signal terminal OUT' under the cooperative control of signals at signal terminals INPUT', CLK, GCH, GCL, RESET and VSS to perform corresponding gate driving.

Figure 1B:
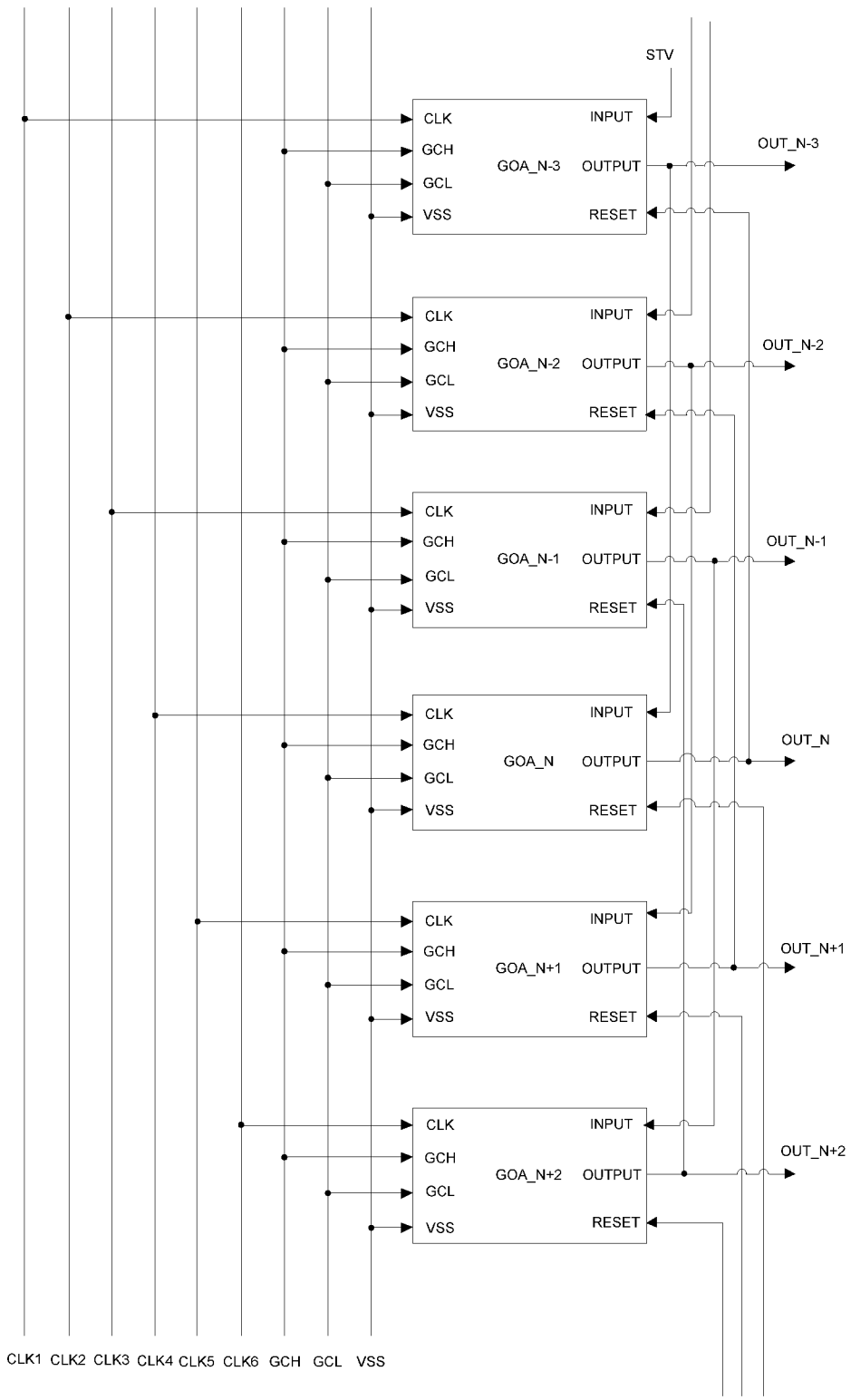
FIG. 1b is a structural diagram of a gate driving circuit after shift register units are cascaded in the related art.

FIG. 1b is a partially structural diagram of a gate driving circuit in the related art, wherein different shift register units perform driving control of different gate lines.

Figure 1C:
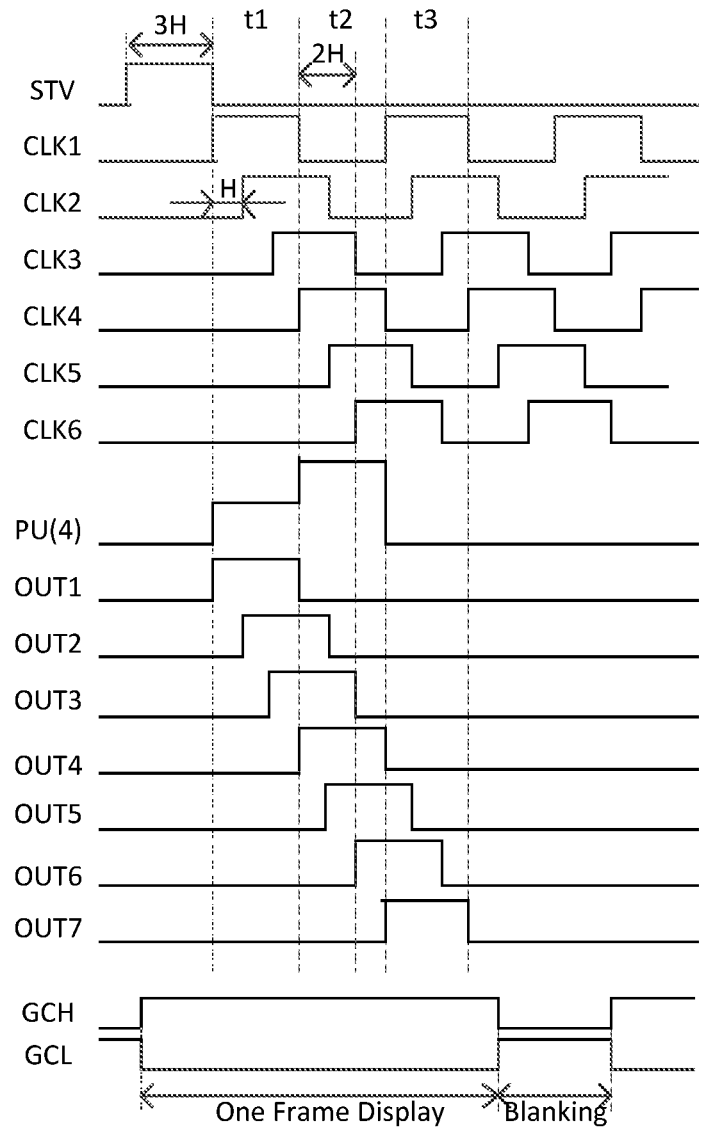
FIG. 1c is a driving timing diagram of a gate driving circuit in the related art.

FIG. 1c is a driving timing diagram of a gate driving circuit in the related art. In FIG. 1c, a gate driving circuit having six clock signals is taken as an example, and clock signals of CLK1 and CLK4, clock signals of CLK2 and CLK5, and clock signals of CLK3 and CLK6 are three groups of square wave signals, wherein each group of square wave signals are mutually inverted. It should be understood that the gate driving circuit having six clock signals is merely exemplary and does not limit the present disclosure. In other embodiments of the present disclosure, a gate driving circuit having four clock signals, eight clock signals, or ten clock signals etc. may also be used, and may specifically be selected according to actual load, refresh rate, etc.

In combination with FIGS. 1b and 1c and by taking an $N^{th}$ shift register unit as an example, an operating process of a driving circuit of the shift register unit may be divided into three phases, which are an input phase t1, an output phase t2, and a reset phase t3. A length of a cycle period of the clock signal is 6H, and each of the phases t1-t3 lasts half of the cycle period, that is 3H.

Thus, power consumption of the shift register unit is calculated in the following equation (1):

$$P_{CLK} = (1/2) * (C_{GOA} + C_{line}) * V^2 * f \quad (1)$$

where $C_{GOA}$ is parasitic capacitance of a TFT in a GOA unit which is connected to a CLK line, and is mainly composed of the gate-drain parasitic capacitance $C_{gd}$;

$C_{line}$ is parasitic capacitance generated by overlap of a CLK line with other signal lines when the CLK line is connected to the GOA unit, wherein $C_{GOA}$ is usually several times or even dozens of times $C_{line}$;

V is a voltage peak value of a CLK signal; and f is a frequency of the CLK signal.

It can be seen that power consumption of the GOA unit is mainly decided by magnitude of the parasitic capacitance $C_{GOA}$ of the TFT connected to the CLK, the voltage peak value V of the CLK signal, and the frequency f of the CLK signal. In order to reduce the power consumption of the GOA, one way is to reduce the parasitic capacitance $C_{GOA}$ of the TFT connected to the CLK line. However, the magnitude of $C_{GOA}$ is limited by a number of TFTs of a row of pixels to be driven, therefore such reduction has limitations. Another way is to reduce the voltage peak value of the CLK signal.

Figure 2:
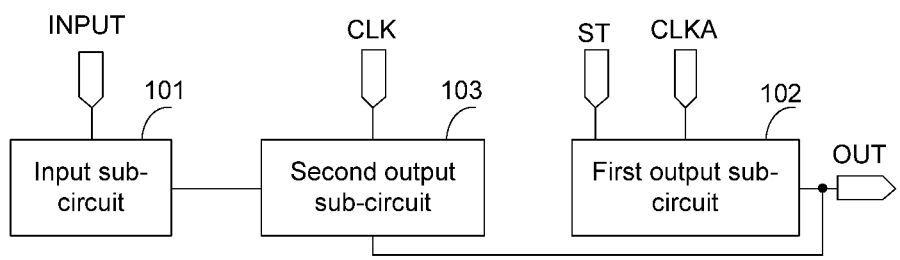
FIG. 2 is a structural diagram of a shift register unit according to an embodiment of the present disclosure.

In a first aspect of the embodiments of the present disclosure, there is provided a shift register unit according to an embodiment, which can reduce the power consumption to some extent. As shown in FIG. 2, illustrated is a structural diagram of a shift register unit according to an embodiment of the present disclosure.

The shift register unit comprises an input signal terminal INPUT configured to receive an input signal, a first voltage signal terminal ST configured to receive a first voltage signal, a first clock signal terminal CLKA configured to receive a first clock signal, a second clock signal terminal CLK configured to receive a second clock signal, and an output signal terminal OUTPUT configured to output a gate driving signal.

The shift register unit further comprises:

an input sub-circuit 101 configured to receive the input signal, and output a pull-up signal according to the input signal;

a first output sub-circuit 102 configured to receive a first voltage signal and a first clock signal, and output a first output signal to the output signal terminal OUTPUT according to the first voltage signal and the first clock signal, so that the output signal terminal OUTPUT outputs a gate driving signal having a first valid level; and a second output sub-circuit 103 configured to receive the pull-up signal and a second clock signal, and output a second output signal to the output signal terminal OUTPUT according to the pull-up signal and the second clock signal, so that the output signal terminal OUTPUT outputs a gate driving signal having a second valid level, an absolute value of which is greater than an absolute value of the first valid level.

It can be seen from the above embodiment that in the shift register unit according to the embodiment of the present disclosure, the first output sub-circuit and the second output sub-circuit are provided to reduce the peak value of the second clock signal while ensuring the output at the output signal terminal. In this way, the power consumption of the second clock signal is reduced, while reducing the power consumption of charging and discharging the parasitic capacitance of the GOA circuit by the second clock signal.

Figure 3:
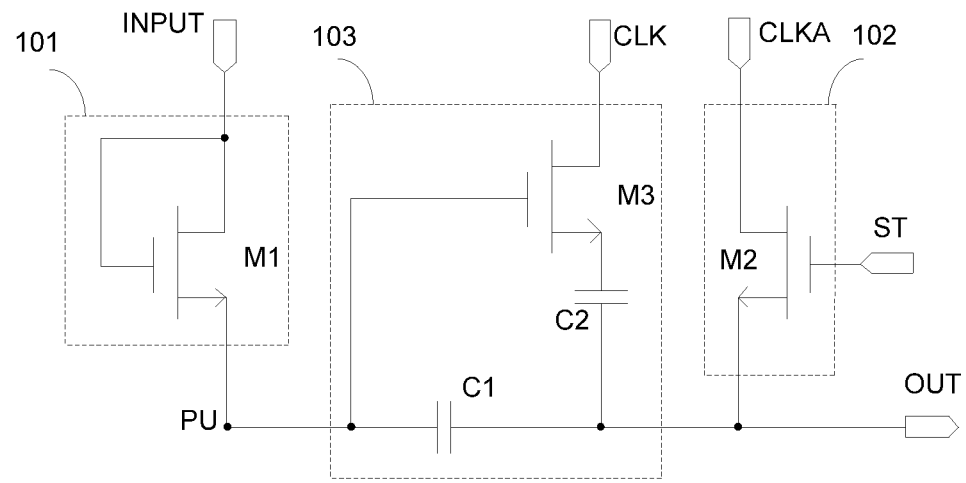
FIG. 3 is a structural diagram of a shift register unit according to another embodiment of the present disclosure.

The present disclosure further provides a shift register unit according to another embodiment, which can reduce the power consumption to some extent. As shown in FIG. 3, illustrated is a structural diagram of a shift register unit according to another embodiment of the present disclosure.

The shift register unit comprises an input signal terminal INPUT configured to receive an input signal, a first voltage signal terminal ST configured to receive a first voltage signal, a first clock signal terminal CLKA configured to receive a first clock signal, a second clock signal terminal CLK configured to receive a second clock signal, and an output signal terminal OUTPUT configured to output a gate driving signal.

The shift register unit further comprises:

an input sub-circuit 101 is configured to receive the input signal, and output a pull-up signal according to the input signal;

wherein the input sub-circuit 101 comprises a first transistor M1 having a gate and a first electrode both connected to the input signal terminal INPUT to receive the input signal, and a second electrode connected to a pull-up node PU to output the pull-up signal to the pull-up node PU. In this way, the input sub-circuit is implemented by using the first transistor M1, which can better realize the control of the input signal;

a first output sub-circuit 102 configured to receive a first voltage signal and a first clock signal, and output a first output signal to the output signal terminal OUTPUT according to the first voltage signal and the first clock signal, so that the output signal terminal OUTPUT outputs a gate driving signal having a first valid level;

wherein the first output sub-circuit 102 comprises a second transistor M2 having a gate connected to the first voltage signal terminal ST to receive the first voltage signal, a first electrode connected to the first clock signal terminal CLKA to receive the first clock signal, and a second electrode connected to the output signal terminal OUTPUT to output the first output signal. In this way, the first output sub-circuit is implemented by using the second transistor M2, which can better realize the control of the first output signal; and a second output sub-circuit 103 configured to receive the pull-up signal and a second clock signal, and output a second output signal to the output signal terminal OUTPUT according to the pull-up signal and the second clock signal, so that the output signal terminal OUTPUT outputs a gate driving signal having a second valid level, an absolute value of which is greater than an absolute value of the first valid level.

wherein the second output sub-circuit 103 comprises a third transistor M3, a first capacitor C1 and a second capacitor C2; wherein the third transistor M3 has a gate connected to the pull-up node PU to receive the pull-up signal, a first electrode connected to the second clock signal terminal CLK to receive the second clock signal, and a second electrode connected to a first terminal of the second capacitor C2; the first capacitor C1 has a first terminal connected to the pull-up node PU, and a second terminal connected to the output signal terminal OUTPUT; and the second capacitor C2 has a second terminal connected to the output signal terminal OUTPUT.

It can be seen from the above embodiment that in the shift register unit according to the embodiment of the present disclosure, the first output sub-circuit and the second output sub-circuit are provided to reduce the peak value of the second clock signal while ensuring the output at the output signal terminal. In this way, the power consumption of the second clock signal is reduced, while reducing the power consumption of charging and discharging the parasitic capacitance of the GOA circuit by the second clock signal.

Figure 4:
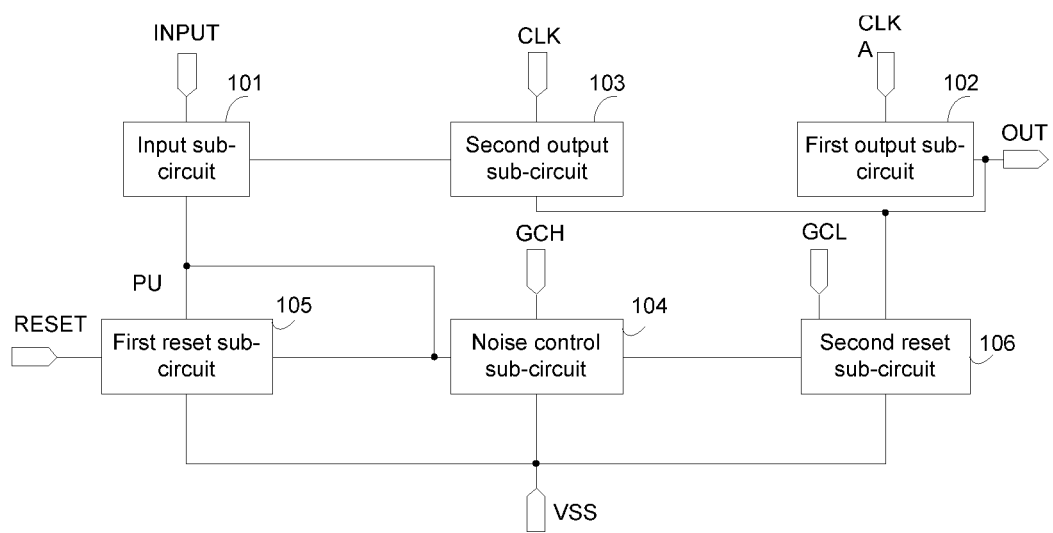
FIG. 4 is a structural diagram of a shift register unit according to still another embodiment of the present disclosure.

The present disclosure further provides a shift register unit according to yet another embodiment, which can reduce the power consumption to some extent. As shown in FIG. 4, illustrated is a structural diagram of a shift register unit according to yet another embodiment of the present disclosure.

The shift register unit comprises an input signal terminal INPUT configured to receive an input signal, a first voltage signal terminal ST configured to receive a first voltage signal, a second voltage signal terminal GCH configured to receive a second voltage signal, a third voltage signal terminal VSS configured to receive a third voltage signal, a first clock signal terminal CLKA configured to receive a first clock signal, a second clock signal terminal CLK configured to receive a second clock signal, a first reset signal terminal RESET configured to receive a first reset signal, a second reset signal terminal GCL configured to receive a second reset signal, and an output signal terminal OUTPUT configured to output a gate driving signal. It should be noted that, in the embodiments of the present disclosure, the second voltage signal from the terminal GCH has a valid level in the driving display phase (including the t1 phase, t2 phase, and t3 phase as below, shown as the one frame display as in the FIG. 7b), the second reset signal from the terminal GCL has a valid level in the blanking phase, and the third voltage signal from the terminal VSS always has an invalid level.

The shift register unit further comprises:

an input sub-circuit 101 configured to receive the input signal, and output a pull-up signal according to the input signal;

a first output sub-circuit 102 configured to receive the first voltage signal and the first clock signal, and output a first output signal to the output signal terminal OUTPUT according to the first voltage signal and the first clock signal, so that the output signal terminal OUTPUT outputs a gate driving signal having a first valid level;

a second output sub-circuit 103 configured to receive the pull-up signal and the second clock signal, and output a second output signal to the output signal terminal OUTPUT according to the pull-up signal and the second clock signal, so that the output signal terminal OUTPUT outputs a gate driving signal having a second valid level, an absolute value of which is greater than an absolute value of the first valid level;

a noise control sub-circuit 104 configured to receive the pull-up signal, the second voltage signal, and the third voltage signal, and control a voltage at a first noise control node PD according to the pull-up signal, the second voltage signal, and the third voltage signal. In this way, the noise control sub-circuit 104 is provided so that the noise of the shift register unit can be better reduced and the voltage at the output terminal can be controlled to be pulled down to an invalid level;

a first reset sub-circuit 105 configured to receive the pull-up signal, the first reset signal, and the third voltage signal, and reset the pull-up node PU to an invalid level according to the pull-up signal, the first reset signal, and the third voltage signal. In this way, the first reset sub-circuit 105 is provided so that the reset of the pull-up node PU can be better completed; and a second reset sub-circuit 106 configured to receive the second reset signal and the third voltage signal, and reset the output signal terminal OUTPUT to an invalid level according to the second reset signal and the third voltage signal. In this way, the second reset sub-circuit 106 is provided so that the reset of the output signal terminal OUTPUT can be better completed.

It can be seen from the above embodiment that in the shift register unit according to the embodiment of the present disclosure, the first output sub-circuit and the second output sub-circuit are provided to reduce the peak value of the second clock signal while ensuring the output at the output signal terminal. In this way, the power consumption of the second clock signal is reduced, while reducing the power consumption of charging and discharging the parasitic capacitance of the GOA circuit by the second clock signal. Further, the noise control sub-circuit is provided to perform noise control on the overall circuit. Moreover, the first reset sub-circuit and the second reset sub-circuit are designed to enable the overall circuit to perform periodic operations and effectively complete display control of a display screen.

The present disclosure further provides a shift register unit according to yet another embodiment, which can reduce the power consumption to some extent. As shown in FIG. 5, illustrated is a structural diagram of a shift register unit according to yet another embodiment of the present disclosure.

The shift register unit comprises an input signal terminal INPUT configured to receive an input signal, a first voltage signal terminal ST configured to receive a first voltage signal, a second voltage signal terminal GCH configured to receive a second voltage signal, a third voltage signal terminal VSS configured to receive a third voltage signal, a first clock signal terminal CLKA configured to receive a first clock signal, a second clock signal terminal CLK configured to receive a second clock signal, a first reset signal terminal RESET configured to receive a first reset signal, a second reset signal terminal GCL configured to receive a second reset signal, and an output signal terminal OUTPUT configured to output a gate driving signal.

The shift register unit further comprises:

an input sub-circuit 101 configured to receive the input signal, and output a pull-up signal according to the input signal;

a first output sub-circuit 102 configured to receive the first voltage signal and the first clock signal, and output a first output signal to the output signal terminal OUTPUT according to the first voltage signal and the first clock signal, so that the output signal terminal OUTPUT outputs a gate driving signal having a first valid level;

a second output sub-circuit 103 configured to receive the pull-up signal and the second clock signal, and output a second output signal to the output signal terminal OUTPUT according to the pull-up signal and the second clock signal, so that the output signal terminal OUTPUT outputs a gate driving signal having a second valid level, an absolute value of which is greater than an absolute value of the first valid level;

a noise control sub-circuit 104 configured to receive the pull-up signal, the second voltage signal, and the third voltage signal, and control a voltage at a first noise control node PD according to the pull-up signal, the second voltage signal, and the third voltage signal. In this way, the noise control sub-circuit 104 is provided, so that the noise of the shift register unit can be better reduced and the voltage at the output terminal can be controlled to be pulled down to an invalid level;

a first reset sub-circuit 105 configured to receive the pull-up signal, the first reset signal, and the third voltage signal, and reset the pull-up node PU to an invalid level according to the pull-up signal, the first reset signal, and the third voltage signal. In this way, the first reset sub-circuit 105 is provided, so that the reset of the pull-up node PU can be better completed;

a second reset sub-circuit 106 configured to receive the second reset signal and the third voltage signal, and reset the output signal terminal OUTPUT to an invalid level according to the second reset signal and the third voltage signal. In this way, the second reset sub-circuit 106 is provided, so that the reset of the output signal terminal OUTPUT can be better completed.

Figure 7A:
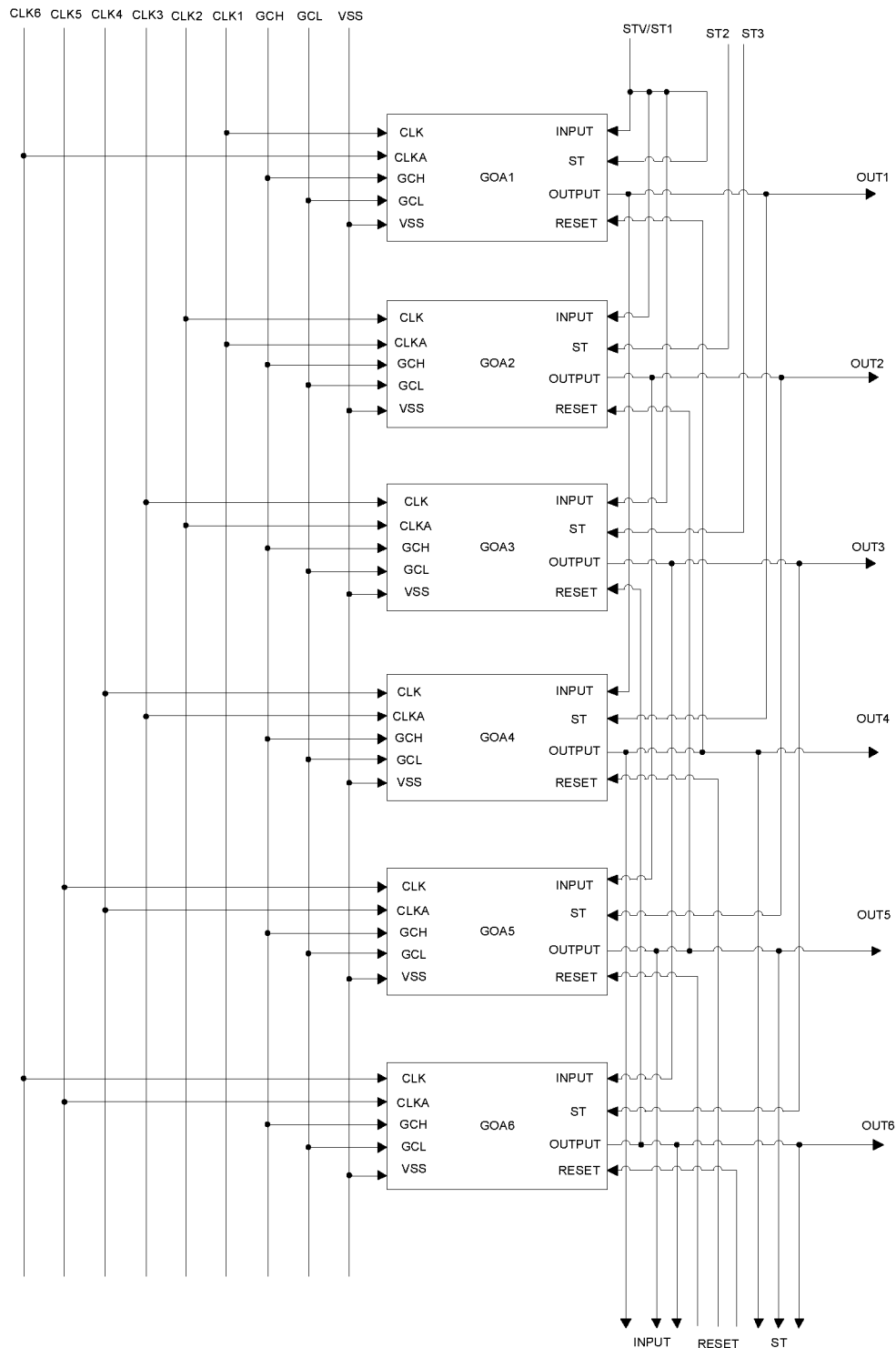
FIG. 7a is a structural diagram of a gate driving circuit according to an embodiment of the present disclosure.
Figure 7B:
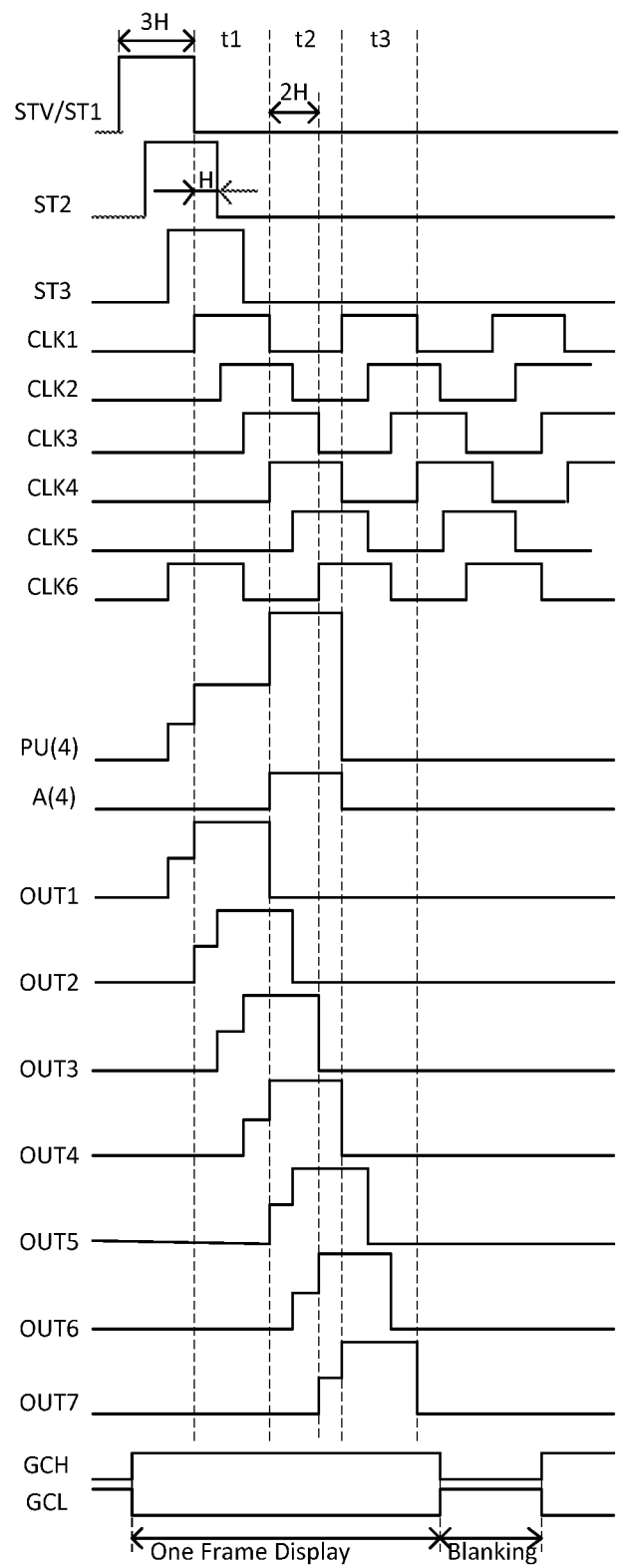
FIG. 7b is a driving timing diagram of a gate driving circuit according to an embodiment of the present disclosure.

Here, the input sub-circuit 101 comprises a first transistor M1; the first output sub-circuit 102 comprises a second transistor M2; the second output sub-circuit 103 comprises a third transistor M3, a first capacitor C1, and a second capacitor C2; the noise control sub-circuit 104 comprises a fourth transistor M4, a fifth transistor M5, a sixth transistor M6, and a seventh transistor M7; the first reset sub-circuit 105 comprises an eighth transistor M8 and a ninth transistor M9; and the second reset sub-circuit 106 comprises a tenth transistor M10 and an eleventh transistor M11. The signal at the first clock signal terminal CLKA is a previous square wave signal of the signal at the second clock signal terminal CLK. As shown in FIGS. 7*a* and 7*b*, for example, when the second clock signal terminal CLK corresponds to the clock signal terminal CLK2, the first clock signal terminal CLKA corresponds to the clock signal terminal CLK1.

The first transistor M1 has a gate and a first electrode both connected to the input signal terminal INPUT to receive the input signal, and a second electrode connected to the pull-up node PU to output the pull-up signal to the pull-up node PU.

The second transistor M2 has a gate connected to the first voltage signal terminal ST to receive the first voltage signal, a first electrode connected to the first clock signal terminal CLKA to receive the first clock signal, and a second electrode connected to the output signal terminal OUTPUT to output the first output signal.

The third transistor M3 has a gate connected to the pull-up node PU to receive the pull-up signal, a first electrode connected to the second clock signal terminal CLK to receive the second clock signal, and a second electrode connected to a first terminal of the second capacitor C2; and the first capacitor C1 has a first terminal connected to the pull-up node PU, and a second terminal connected to the output signal terminal OUTPUT.

The fourth transistor M4 has a gate and a first electrode both connected to the second voltage signal terminal GCH to receive the second voltage signal, and a second electrode connected to the second noise control node PDN.

The fifth transistor M5 has a gate connected to the second noise control node PDN, a first electrode connected to the second voltage signal terminal GCH to receive the second voltage signal, and a second electrode connected to the first noise control node PD.

The sixth transistor M6 has a gate connected to the pull-up node PU, a first electrode connected to the second noise control node PDN, and a second electrode connected to the third voltage signal terminal VSS to receive the third voltage signal.

The seventh transistor M7 has a gate connected to the pull-up node PU, a first electrode connected to the first noise control node PD, and a second electrode connected to the third voltage signal terminal VSS to receive the third voltage signal.

The eighth transistor M8 has a gate connected to the first reset signal terminal RESET to receive the first reset signal, a first electrode connected to the pull-up node PU, and a second electrode connected to the third voltage signal terminal VSS to receive the third voltage signal.

The ninth transistor M9 has a gate connected to the first noise control node PD, a first electrode connected to the pull-up node PU, and a second electrode connected to the third voltage signal terminal VSS to receive the third voltage signal.

The tenth transistor M10 has a gate connected to the second reset signal terminal GCL to receive the second reset signal, a first electrode connected to the output signal terminal OUTPUT, and a second electrode connected to the third voltage signal terminal VSS to receive the third voltage signal.

The eleventh transistor M11 has a gate connected to the first noise control node PD, a first electrode connected to the output signal terminal OUTPUT, and a second electrode connected to the third voltage signal terminal VSS to receive the third voltage signal.

An operating process of the driving circuit of the shift register unit will be briefly described below with reference to FIGS. 5, 7*a* and 7*b* above by taking the shift register unit being a fourth shift register unit GOA4 in the gate driving circuit as an example.

A timing of the second clock signal may be known with reference to the signal at the clock signal terminal CLK4 in FIG. 7*b*, a timing of the first clock signal may be known with reference to the signal at the clock signal terminal CLK3 in FIG. 7*b*, a timing of the input signal may be known with reference to the signal at the output signal terminal OUT1 in FIG. 7*b*, a timing of the first voltage signal may be known with reference to the signal at the output signal terminal OUT1 in FIG. 7*b*, and a timing of the first reset signal may be known with reference to the signal at the output signal terminal OUT7 in FIG. 7*b*.

In a t1 phase, i.e., an input phase, the signal at the output signal terminal OUT1 is at a high level, and therefore the input signal at the shift register unit GOA4 is at a high level, which pulls up the pull-up node PU through the input sub-circuit 101; the six transistors M6 and the seventh transistor M7 of the noise control module 104 are turned on, to pull down the first noise control node PD, and the ninth transistor M9 and the eleventh transistor M11 are turned off; the third transistor M3 is turned on, and since the second clock signal is at a low level at this time, the node A (as shown in FIG. 5) is at a low level; and the second transistor M2 of the first output sub-circuit 102 is turned on, and the first clock signal output to the output terminal during a last period H of the t1 phase is at a high level of V (i.e., the first valid level).

In a t2 phase, i.e., an output phase, the signal at the output signal terminal OUT1 is at a low level, and therefore the second transistor M2 is turned off. Since the second clock signal is at a high level of V at this time, the node A is at a high level of V, and charges the second capacitor C2. Further, due to the bootstrap action of the second capacitor C2 in the second output sub-circuit 103 at this time, the output level at the output terminal jumps to 2V (i.e., the second valid level). Due to the bootstrap action of the first capacitor C1, the level at the pull-up node PU jumps to 4V.

In a t3 phase, i.e., a reset phase, the signal at the output signal terminal OUT7 is at a high level of 2V, the eighth transistor M8 is turned on, and therefore the pull-up node PU is pulled down to realize a resetting operation. The first noise control node PD returns to a high level, the sixth transistor M6 and the seventh transistor M7 are turned on, and therefore the potential at the output signal terminal OUT-PUT is pulled down.

In the display period of one frame, such t1-t3 phases exist for each shift register unit, with a time shift H between adjacent shift register units. In the blanking period after the display period, output signals of all shift register units are discharged by the second reset signal GCL through the tenth transistor M10, so as to complete an overall resetting operation of the driving circuit.

It can be seen from the above embodiment that in the shift register unit according to the embodiments of the present disclosure, the first output sub-circuit and the second output sub-circuit are provided, so that the first output sub-circuit, as an auxiliary pull-up module, outputs a signal at a high level having an amplitude of V according to the first voltage signal and the first clock signal before the output period of the shift register unit, and then the second output sub-circuit increases the output signal from a first valid level to a second valid level according to the pull-up signal and the second clock signal and outputs the output signal in the output period of the shift register unit (i.e., when the second clock signal is at a high level of V, the output signal at the output terminal OUTPUT jumps to 2V due to the bootstrap action of the second capacitor C2, so that the shift register unit outputs a signal at a high level having an amplitude of 2V). In this way, the peak value of the second clock signal is reduced, thereby reducing the power consumption of the second clock signal (since the shift register unit according to the embodiments of the present disclosure can enable the output signal to jump to 2V, the amplitude of the second clock signal can be reduced by half, and therefore the power consumption can be reduced by ¾ since the power consumption is positively correlated with a square of a voltage peak value of the second clock signal), while reducing the power consumption of charging and discharging the parasitic capacitance of the GOA circuit by the second clock signal. Thereby, the power consumption and driving requirements of the display panel can be greatly reduced, and the stability of the display can be increased. Further, the noise control sub-circuit is provided to perform noise control on the overall circuit, thereby enabling effective control of the gate. Moreover, the first reset sub-circuit and the second reset sub-circuit are designed to enable the overall circuit to perform periodic operations and effectively complete display control of the display screen.

It should be illustrated that the above embodiments are described by taking a circuit using an NMOS TFT process as an example. For a circuit using a PMOS TFT process which has the same structure as that of the circuit using the NMOS TFT process, it only needs to reverse various operating voltages and timings. In the above embodiments, a specific operating operation of the shift register unit is described by taking a 6CLK gate driving circuit as an example, and is also applicable to GOA driving circuits such as 4CLK, 8CLK, 10CLK etc. The above embodiments are applicable to various manufacturing processes such as a-Si, Oxide, LTPS, HTPS, etc.

In a second aspect of the embodiments of the present disclosure, there is provided a method for driving a shift register unit according to an embodiment, which can reduce the power consumption to some extent. FIG. 6a illustrates a schematic flowchart of a method for driving a shift register unit according to an embodiment of the present disclosure.

The method for driving a shift register unit (a timing diagram thereof is shown in FIG. 7b) is used to drive the shift register unit according to any embodiment described above. The method for driving a shift register unit comprises the following steps.

In step 201, in a first period, a first voltage signal and a first clock signal having a first valid level are provided, so that the output signal terminal outputs a gate driving signal having a first valid level.

In step 202, in a second period, an input signal and a second clock signal having a first valid level are provided, so that the output signal terminal outputs a gate driving signal having a second valid level.

Figure 6B:
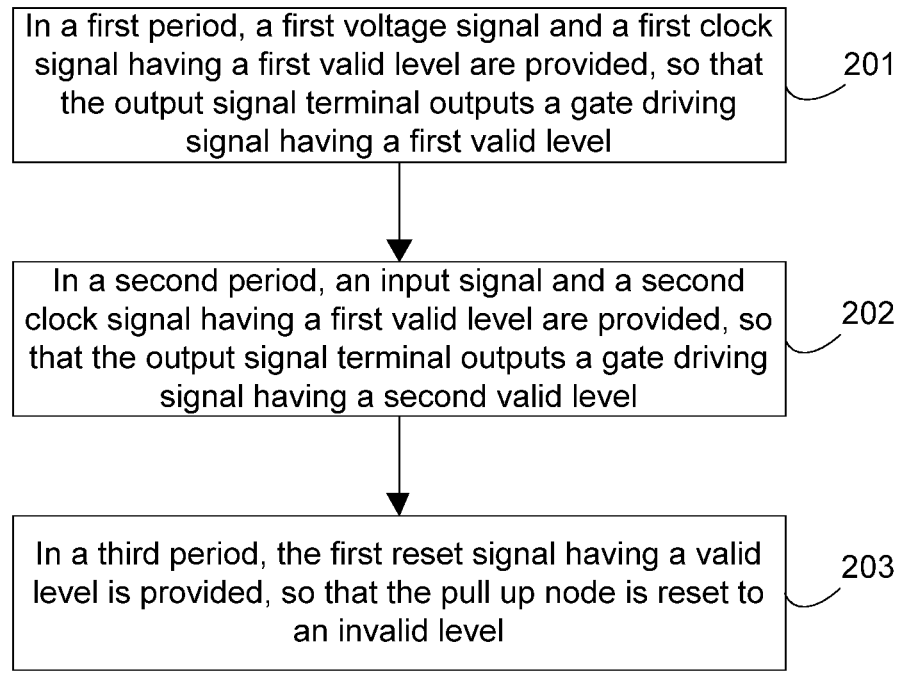
FIG. 6b is a flowchart of a method for driving a shift register unit according to another embodiment of the present disclosure.

FIG. 6b illustrates a schematic flowchart of a method for driving a shift register unit according to another embodiment of the present disclosure.

As compared with the driving method in FIG. 6a, the driving method in FIG. 6b further comprises a step 203 as below:

In step 203, in a third period, the first reset signal having a valid level is provided, so that the pull up node is reset to an invalid level.

It can be seen from the above embodiments of FIGS. 6a and 6b that in the method for driving a shift register unit according to the embodiment of the present disclosure, the first output sub-circuit and the second output sub-circuit are provided to reduce the peak value of the second clock signal while ensuring the output at the output signal terminal. In this way, the power consumption of the second clock signal is reduced, while reducing the power consumption of charging and discharging the parasitic capacitance of the GOA circuit by the second clock signal.

The method for driving a shift register unit will be briefly described below with reference to FIGS. 5, 7a and 7b above by taking the shift register unit being a fourth shift register unit GOA4 in the gate driving circuit as an example.

A timing of the second clock signal may be known with reference to the signal at the clock signal terminal CLK4 in FIG. 7b, a timing of the first clock signal may be known with reference to the signal at the clock signal terminal CLK3 in FIG. 7b, a timing of the input signal may be known with reference to the signal at the output signal terminal OUT1 in FIG. 7b, a timing of the first voltage signal may be known with reference to the signal at the output signal terminal OUT1 in FIG. 7b, and a timing of the first reset signal may be known with reference to the signal at the output signal terminal OUT7 in FIG. 7b.

In a t1 phase, i.e., an input phase (corresponding to the first period in step 201), the signal at the output signal terminal OUT1 is at a high level, and therefore the input signal at the shift register unit GOA4 is at a high level, which pulls up the pull-up node PU through the input sub-circuit 101; the six transistors M6 and the seventh transistor M7 of the noise control module 104 are turned on, to pull down the first noise control node PD, and the ninth transistor M9 and the eleventh transistor M11 are turned off; the third transistor M3 is turned on, and since the second clock signal is at a low level at this time, the node A (as shown in FIG. 5) is at a low level; and the second transistor M2 of the first output sub-circuit 102 is turned on, and the first clock signal output to the output terminal during a last period H of the t1 phase is at a high level of V (i.e., the first valid level).

In a t2 phase, i.e., an output phase (corresponding to the second period in step 202), the signal at the output signal terminal OUT1 is at a low level, and therefore the second transistor M2 is turned off. Since the second clock signal is at a high level of V at this time, the node A is at a high level of V, and charges the second capacitor C2. Further, due to the bootstrap action of the second capacitor C2 in the second output sub-circuit 103 at this time, the output level at the output terminal jumps to 2V (i.e., the second valid level). Due to the bootstrap action of the first capacitor C1, the level at the pull-up node PU jumps to 4V.

In a t3 phase, i.e. the resetting phase (corresponding to the third period in step 203), the signal at the output signal terminal OUT7 outputs a high level of 2V, the eighth transistor M8 is turned on, and therefore the pull-up node PU is pulled down to realize a resetting operation. The first noise control node PD returns to a high level, the sixth transistor M6 and the seventh transistor M7 are turned on, and therefore the potential at the output signal terminal OUTPUT is pulled down.

In the display period of one frame, such t1-t3 phases exist for each shift register unit, with a time shift H between adjacent shift register units. In the blanking period after the display period, output signals of all shift register units are discharged by the second reset signal GCL through the tenth transistor M10, so as to complete an overall resetting operation of the driving circuit.

In a third aspect of the embodiments of the present disclosure, there is provided a gate driving circuit according to an embodiment, which can reduce the power consumption to some extent. As shown in FIG. 7a, illustrated is a structural diagram of a gate driving circuit according to an embodiment of the present disclosure.

The gate driving circuit comprises the shift register unit according to any embodiment described above.

An input signal terminal INPUT and a first voltage signal terminal of an $N^{th}$ stage of shift register unit (for example, GOA4 in FIG. 7a) are both connected to an output signal terminal OUTPUT of an $(N-3)^{th}$ stage of shift register unit (for example, GOA1 in FIG. 7a), and a first clock signal terminal CLKA and a second clock signal terminal CLK of the $N^{th}$ stage of shift register unit (for example, GOA4 in FIG. 7a) receive a first clock signal and a second clock signal, respectively. Here, in the gate driving circuit, first clock signals and second clock signals received by different shift register units are different respectively. As shown in FIGS. 7a and 7b, a first clock signal and a second clock signal of the shift register unit GOA1 are signals at a clock signal terminal CLK6 and a clock signal terminal CLK1 respectively, and a first clock signal and a second clock signal of the shift register unit GOA4 are signals at the clock signal terminal CLK1 and a clock signal terminal CLK2, respectively. In theory, a first clock signal received at a first clock signal terminal CLKA is a previous square wave signal of a clock signal received at a second clock signal terminal CLK.

In one embodiment, a first reset signal terminal RESET of the $N^{th}$ stage of shift register unit (for example, GOA4 in FIG. 7a) is connected to an output signal terminal OUTPUT of an $(N+3)^{th}$ stage of shift register unit (for example, GOA7 in FIG. 7a).

FIG. 7b exemplarily illustrates a timing diagram of a gate driving circuit by taking six clock signals (6 CLKs) as an example. Signals of CLK1 and CLK4, signals of CLK2 and CLK5, and signals of CLK3 and CLK6 are three groups of square wave signals, wherein each group of square wave signals are mutually inverted. In addition to the gate driving circuit having six clock signals, a gate driving circuit having four clock signals, eight clock signals, or ten clock signals, etc. may be used, and may specifically be selected according to actual load, refresh rate, etc. Various clock signals operate independently of each other and do not affect each other.

Unlike the timing diagram of the 6CLK gate driving circuit in the related art, in the embodiment of the present disclosure, it is necessary to add ST1, ST2, and ST3 signals as turn-on signals (i.e., first voltage signals) of first output sub-circuits of shift register units GOA1, GOA2, and GOA3, respectively, wherein ST1 and STV may use the same signal. When N≥4, a turn-on signal ST of the $N^{th}$ stage of shift register unit is provided by a signal at the output signal terminal OUT(N−3) of the $(N−3)^{th}$ stage of shift register unit; and at the beginning of each frame, a signal at the clock signal terminal CLK6 needs to output a high level one cycle ahead of a timing of the gate driving circuit in the related art, as a first clock signal of a first output sub-circuit of a first shift register unit.

In the gate driving circuit as in FIG. 7a, each stage of shift register units can operate as the exemplary GOA4 in the embodiment as above, and by appropriately setting the clock signals, shifted output to various gate lines connected to the shift register units can be achieved. The details will not be described herein, as those skilled in the art would understand them based on the structure as shown in FIG. 7a and the exemplary description of GOA4 as above.

It can be seen from the above embodiment that in the gate driving circuit according to the embodiment of the present disclosure, the first output sub-circuit and the second output sub-circuit are provided to reduce the peak value of the second clock signal while ensuring the output at the output signal terminal. In this way, the power consumption of the second clock signal is reduced, while reducing the power consumption of charging and discharging the parasitic capacitance of the GOA circuit by the second clock signal.

In a fourth aspect of the embodiments of the present disclosure, there is provided an array substrate according to an embodiment, which can reduce the power consumption to some extent. The array substrate comprises the gate driving circuit according to any embodiment described above.

In a fifth aspect of the embodiments of the present disclosure, there is provided a display apparatus according to an embodiment, which can reduce the power consumption to some extent. The display apparatus comprises the array substrate described above. It should be illustrated that the display apparatus according to the present embodiment may be any product or component having a display function, such as an electronic paper, a mobile phone, a tablet computer, a television, a notebook computer, a digital photo frame, a navigator, etc.

This is merely exemplary and is not intended to limit the present disclosure, and various modifications and changes can be made to the present disclosure by those skilled in the art. Any modifications, equivalent substitutions, improvements, etc. made within the spirit and principle of the present disclosure are intended to be included within the protection scope of the present disclosure.

We claim:

1. A shift register unit, comprising an input signal terminal configured to receive an input signal, a first voltage signal terminal configured to receive a first voltage signal, a first clock signal terminal configured to receive a first clock signal, a second clock signal terminal configured to receive a second clock signal and an output signal terminal configured to output a gate driving signal, the shift register unit further comprising:
    an input sub-circuit configured to receive the input signal and output a pull-up signal according to the input signal;
    a first output sub-circuit configured to receive the first voltage signal and the first clock signal, and output a first output signal to the output signal terminal according to the first voltage signal and the first clock signal, so that the output signal terminal outputs the gate driving signal having a first valid level; and
    a second output sub-circuit configured to receive the pull-up signal and the second clock signal, and output a second output signal to the output signal terminal according to the pull-up signal and the second clock signal, so that the output signal terminal outputs the gate driving signal having a second valid level, wherein an absolute value of the second valid signal is greater than an absolute value of the first valid level.

2. The shift register unit according to claim 1, wherein the input sub-circuit comprises a first transistor, wherein
    the first transistor has a gate and a first electrode both connected to the input signal terminal to receive the input signal, and a second electrode connected to a pull-up node to output the pull-up signal to the pull-up node.

3. The shift register unit according to claim 1, wherein the first output sub-circuit comprises a second transistor, wherein
    the second transistor has a gate connected to the first voltage signal terminal to receive the first voltage signal, a first electrode connected to the first clock signal terminal to receive the first clock signal, and a second electrode connected to the output signal terminal to output the first output signal.

4. The shift register unit according to claim 1, wherein the second output sub-circuit comprises a third transistor, a first capacitor, and a second capacitor, wherein
    the third transistor has a gate connected to a pull-up node to receive the pull-up signal, a first electrode connected to the second clock signal terminal to receive the second clock signal, and a second electrode connected to a first terminal of the second capacitor,
    the first capacitor has a first terminal connected to the pull-up node, and a second terminal connected to the output signal terminal, and
    the second capacitor has a second terminal connected to the output signal terminal.

5. The shift register unit according to claim 1, further comprising: a second voltage signal terminal configured to receive a second voltage signal, a third voltage signal terminal configured to receive a third voltage signal, and a noise control sub-circuit, wherein
    the noise control sub-circuit is configured to receive the pull-up signal, the second voltage signal, and the third voltage signal, and control a voltage at a first noise control node according to the pull-up signal, the second voltage signal, and the third voltage signal.

6. The shift register unit according to claim 5, wherein the noise control sub-circuit comprises a fourth transistor, a fifth transistor, a sixth transistor, and a seventh transistor, wherein
    the fourth transistor has a gate and a first electrode both connected to the second voltage signal terminal to receive the second voltage signal, and a second electrode connected to a second noise control node,
    the fifth transistor has a gate connected to the second noise control node, a first electrode connected to the second voltage signal terminal to receive the second voltage signal, and a second electrode connected to the first noise control node,
    the sixth transistor has a gate connected to a pull-up node, a first electrode connected to the second noise control node, and a second electrode connected to the third voltage signal terminal to receive the third voltage signal, and
    the seventh transistor has a gate connected to the pull-up node, a first electrode connected to the first noise control node, and a second electrode connected to the third voltage signal terminal to receive the third voltage signal.

7. The shift register unit according to claim 5, further comprising a first reset signal terminal configured to receive a first reset signal and a first reset sub-circuit, wherein
    the first reset sub-circuit is configured to receive the pull-up signal, the first reset signal, and the third voltage signal, and reset a pull-up node to an invalid level according to the pull-up signal, the first reset signal, and the third voltage signal.

8. The shift register unit according to claim 7, wherein the first reset sub-circuit comprises an eighth transistor and a ninth transistor, wherein
    the eighth transistor has a gate connected to the first reset signal terminal to receive the first reset signal, a first electrode connected to the pull-up node, and a second electrode connected to the third voltage signal terminal to receive the third voltage signal, and
    the ninth transistor has a gate connected to the first noise control node, a first electrode connected to the pull-up node, and a second electrode connected to the third voltage signal terminal to receive the third voltage signal.

9. The shift register unit according to claim 5, further comprising a second reset signal terminal configured to receive a second reset signal and a second reset sub-circuit, wherein
    the second reset sub-circuit is configured to receive the second reset signal and the third voltage signal, and reset the output signal terminal to an invalid level according to the second reset signal and the third voltage signal.

10. The shift register unit according to claim 9, wherein the second reset sub-circuit comprises a tenth transistor and an eleventh transistor, wherein the tenth transistor has a gate connected to the second reset signal terminal to receive the second reset signal, a first electrode connected to the output signal terminal, and a second electrode connected to the third voltage signal terminal to receive the third voltage signal, and the eleventh transistor has a gate connected to the first noise control node, a first electrode connected to the output signal terminal, and a second electrode connected to the third voltage signal terminal to receive the third voltage signal.

11. A gate driving circuit, comprising N stages of cascaded shift register units, wherein N is an integer greater than 1, wherein at least one of the N stages of shift register units is the shift register unit according to claim 1.

12. A gate driving circuit, comprising N stages of cascaded shift register units, wherein N is an integer greater than 1, wherein at least one of the N stages of shift register units is the shift register unit according to claim 5.

13. A gate driving circuit, comprising N stages of cascaded shift register units, wherein N is an integer greater than 1, wherein at least one of the N stages of shift register units is the shift register unit according to claim 7.

14. A gate driving circuit, comprising N stages of cascaded shift register units, wherein N is an integer greater than 1, wherein at least one of the N stages of shift register units is the shift register unit according to claim 9.

15. An array substrate, comprising the gate driving circuit according to claim 11.

16. A display apparatus, comprising the array substrate according to claim 15.

17. A method for driving the shift register unit according to claim 1, comprising:
providing, in a first period, the first voltage signal and the first clock signal having the first valid level, so that the output signal terminal outputs the gate driving signal having the first valid level; and providing, in a second period, the input signal and the second clock signal having the first valid level, so that the output signal terminal outputs the gate driving signal having the second valid level.

18. The method according to claim 17, wherein the shift register unit further comprising a second voltage signal terminal configured to receive a second voltage signal, a third voltage signal terminal configured to receive a third voltage signal, and a noise control sub-circuit, the method further comprises:
In the first period and the second period, providing the second voltage signal having a valid level, and providing the third voltage signal having an invalid level.

19. A method for driving the shift register unit according to claim 7, comprising:
providing, in a first period, the first voltage signal and the first clock signal having the first valid level, so that the output signal terminal outputs the gate driving signal having the first valid level;

providing, in a second period, the input signal and the second clock signal having the first valid level, so that the output signal terminal outputs the gate driving signal having the second valid level; and providing, in a third period, the first reset signal having a valid level, so that a pull up node is reset to an invalid level.

20. The method according to claim 19, wherein the shift register unit further comprising a second voltage signal terminal configured to receive a second voltage signal, a third voltage signal terminal configured to receive a third voltage signal, and a noise control sub-circuit, the method further comprises:
In the first period, the second period and the third period, providing the second voltage signal having a valid level, and providing the third voltage signal having an invalid level.

* * * * *